US012577700B2

(12) United States Patent
Phillips

(10) Patent No.: US 12,577,700 B2
(45) Date of Patent: Mar. 17, 2026

(54) NON-CONTACT SYSTEMS AND METHODS FOR DETERMINING DISTANCE BETWEEN SILICON MELT AND REFLECTOR IN A CRYSTAL PULLER

(71) Applicant: GlobalWafers Co., Ltd., Hsinchu (TW)

(72) Inventor: Richard Joseph Phillips, St. Peters, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 265 days.

(21) Appl. No.: 18/341,917

(22) Filed: Jun. 27, 2023

(65) Prior Publication Data

US 2024/0003050 A1     Jan. 4, 2024

Related U.S. Application Data

(60) Provisional application No. 63/357,734, filed on Jul. 1, 2022.

(51) Int. Cl.
C30B 15/24     (2006.01)
C30B 15/26     (2006.01)
C30B 29/06     (2006.01)

(52) U.S. Cl.
CPC .............. C30B 15/24 (2013.01); C30B 15/26 (2013.01); C30B 29/06 (2013.01)

(58) Field of Classification Search
CPC ......... C30B 15/24; C30B 15/26; C30B 29/06; Y10T 117/1032
See application file for complete search history.

(56) References Cited

U.S. PATENT DOCUMENTS 6,726,764 B2     4/2004     Mutti et al.
8,317,919 B2     11/2012     Bender 2001/0054376 A1     12/2001     Miura et al.
2010/0175611 A1     7/2010     Takanaski
2016/0312379 A1     10/2016     Chen et al.

FOREIGN PATENT DOCUMENTS

| EP | 1279752 A1 * | 1/2003 | .............. C30B 15/20 |
| JP | 2005041705 A | 2/2005 | |
| JP | 4293395 B2 * | 7/2009 | .............. C30B 15/14 |
| JP | 4616949 B2 * | 1/2011 | .............. C30B 15/26 |
| TW | 1541392 * | 4/2015 | |

OTHER PUBLICATIONS

PEM™, Chopping a Light Beam; Product Sheet; Fall 1995; Hinds Instruments, Inc., pp. 1-4.
International Search Report and Written opinion issued in PCT/US2023/026312 mailed Sep. 29, 2023; pp. 1-10.

* cited by examiner

*Primary Examiner* — Robert M Kunemund

(74) *Attorney, Agent, or Firm* — Armstrong Teasdale LLP

(57)     ABSTRACT

A measurement system includes a target object at least partially visible through an opening in a crystal puller. The crystal puller has a silicon melt in a crucible and a reflector defining a central passage through which a crystal is pulled. A detector array captures light through the opening. The detector array is directed to a surface of the silicon melt in the crystal puller and to the target object, and a laser selectively transmits a coherent light beam through the opening to the target object to produce a reflection of the target object on the surface of the silicon melt. An optical modulator pulses the coherent light beams of the laser into discrete coherent light beams having a period, and a lock-in amplifier is connected to the detector array to filter discrete coherent light having the period from captured light.

20 Claims, 7 Drawing Sheets

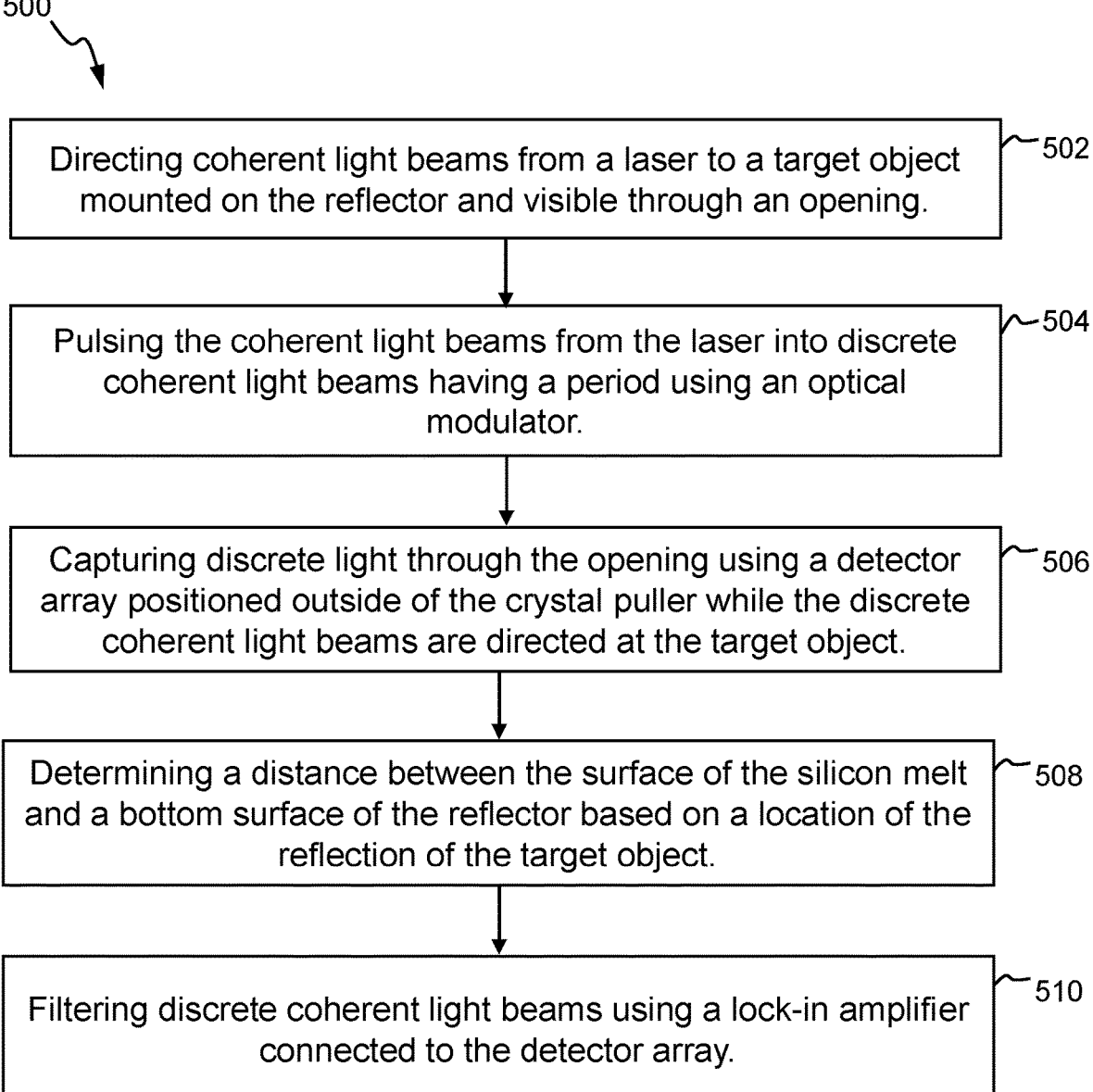

500

Directing coherent light beams from a laser to a target object mounted on the reflector and visible through an opening. ⌐502

Pulsing the coherent light beams from the laser into discrete coherent light beams having a period using an optical modulator. ⌐504

Capturing discrete light through the opening using a detector array positioned outside of the crystal puller while the discrete coherent light beams are directed at the target object. ⌐506

Determining a distance between the surface of the silicon melt and a bottom surface of the reflector based on a location of the reflection of the target object. ⌐508

Filtering discrete coherent light beams using a lock-in amplifier connected to the detector array. ⌐510

NON-CONTACT SYSTEMS AND METHODS FOR DETERMINING DISTANCE BETWEEN SILICON MELT AND REFLECTOR IN A CRYSTAL PULLER

CROSS REFERENCE TO RELATED APPLICATION

This application claims priority to U.S. Provisional Patent Application Ser. No. 63/357,734 filed on Jul. 1, 2022, the disclosure of which is hereby incorporated by reference in its entirety.

FIELD

The field generally relates to the production of silicon ingots, and more specifically, to non-contact methods and systems for determining distance between a silicon melt and a reflector in a crystal puller.

BACKGROUND

Some crystal pullers include a reflector positioned above a silicon melt. During operation of the crystal puller, it may be beneficial to know the distance (referred to as "HR") between the bottom of the reflector and the surface of the silicon melt. HR measurement accuracy is typically less than 1 mm, with more desirable accuracies in the 0.1 to 0.2 mm range.

HR measurement is difficult to perform with known methods because measuring HR involves observing and tracking features inside an extremely hot puller under vacuum or low-pressure conditions. These conditions generally limit the types of sensors and materials that can be used inside the puller. Because thermal expansion will generally affect parts that are not actively cooled, measurements made before a pull or run starts may not be usable or helpful after the puller is brought up to run temperature. Also, the resolution and accuracy of optical sensors and detector arrays used to measure distances within the crystal puller can be impacted by energy emission from molten or heated materials within the crystal pullers. In particular, photoluminescence and thermoluminescence can emit incoherent light which lowers the resolution of the sensors.

Thus, there is a need to improve the resolution and accuracy of optical sensors and detector arrays used to measure distances within the crystal puller.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a crystal puller has at least one heater, a silicon melt in a crucible and a measurement system for determining a distance between the silicon melt and a reflector while a crystal is being pulled from the silicon melt. The system includes a reflector defining a central passage through which the crystal is pulled and an opening and, a measurement assembly. The measurement system further includes a target object at least partially visible through the opening, and a detector array to capture light through the opening. The detector array directed to a surface of the silicon melt in the crystal puller and to the target object. The measurement system further includes a laser to selectively transmit a coherent light beam through the opening to the target object to produce a reflection of the target object on the surface of the silicon melt. The measurement system further includes an optical modulator to pulse the coherent light beams of the laser into discrete coherent light beams having a period and, a controller connected to the detector array, the laser and the optical modulator. The controller is programmed to control the laser to direct the discrete coherent light beams from the laser to the target object, control the optical modulator to pulse the coherent light beams of the laser into discrete coherent light beams, and to control the detector array to capture light through the opening while the discrete coherent light beams are directed at the target object. The captured light including at least a part of the surface of the silicon melt on which the reflection of the target object is visible and, the controller is programmed control the detector array to filter the discrete coherent light beams having the period from the captured light.

In another aspect, a measurement system includes a target object at least partially visible through an opening in a crystal puller, the crystal puller having a silicon melt in a crucible and a reflector defining a central passage through which a crystal is pulled, and a detector array to capture light through the opening. The detector array is directed to a surface of the silicon melt in the crystal puller and to the target object. The measurement system further includes a laser to selectively transmit a coherent light beam through the opening to the target object to produce a reflection of the target object on the surface of the silicon melt and an optical modulator to pulse the coherent light beams of the laser into discrete coherent light beams having a period. The measurement system further includes a lock-in amplifier connected to the detector array to filter discrete coherent light having the period from captured light. A controller is programmed to determine measurement distances from a surface of the silicon melt while the crystal is being pulled from the silicon melt by controlling the laser to direct coherent light beams from the laser to a first end of the target object. The first end visible by the laser through the opening. The controller is programmed to control the optical modulator to pulse the coherent light beam of the laser, to control the detector array to capture light, to control a lock-in amplifier to filter discrete coherent light beams having the period from the captured light. The lock-in amplifier is connected to the detector array, and the controller determines a measurement distance between the surface of the silicon melt and a bottom surface of the reflector based on a location of the reflection of the target object.

In yet another aspect, a method determines a distance between a silicon melt in a crucible and a reflector in a crystal puller while a crystal is being pulled from the silicon melt using a measurement system. The method includes the steps of directing coherent light beams from a laser to a target object mounted on the reflector and visible through an opening. The laser is positioned outside of the crystal puller, and coherent light beams are pulsed from the laser into discrete coherent light beams having a period using an optical modulator. The optical modulator is selected from a pulse width modulator and an optical chopper. The pulse width modulator is connected to the laser and pulses the coherent light beams of the laser. The optical chopper is positioned between the laser and the target object to chop the coherent light beams of the laser. Discrete light is captured through the opening using a detector array positioned outside of the crystal puller while the discrete coherent light beams are directed at the target object. The captured light includes at least a part of a surface of the silicon melt on which the reflection of the target object is visible. A controller determines a distance between the surface of the silicon melt and a bottom surface of the reflector based on a location of the reflection of the target object.

Various refinements exist of the features and steps noted in relation to the above aspects. Further features may also be incorporated in the above-mentioned aspect as well. These refinements and additional features may exist individually or in any combination. For instance, various features and steps discussed below in relation to any of the illustrated embodiments may be incorporated into the above-described aspect, alone or in any combination.

BRIEF DESCRIPTION OF THE DRAWINGS

FIG. 7 is a flow chart of a method of using the measurement assembly of FIG. 1.

Like reference symbols in the various drawings indicate like elements.

DETAILED DESCRIPTION

Figure 1:
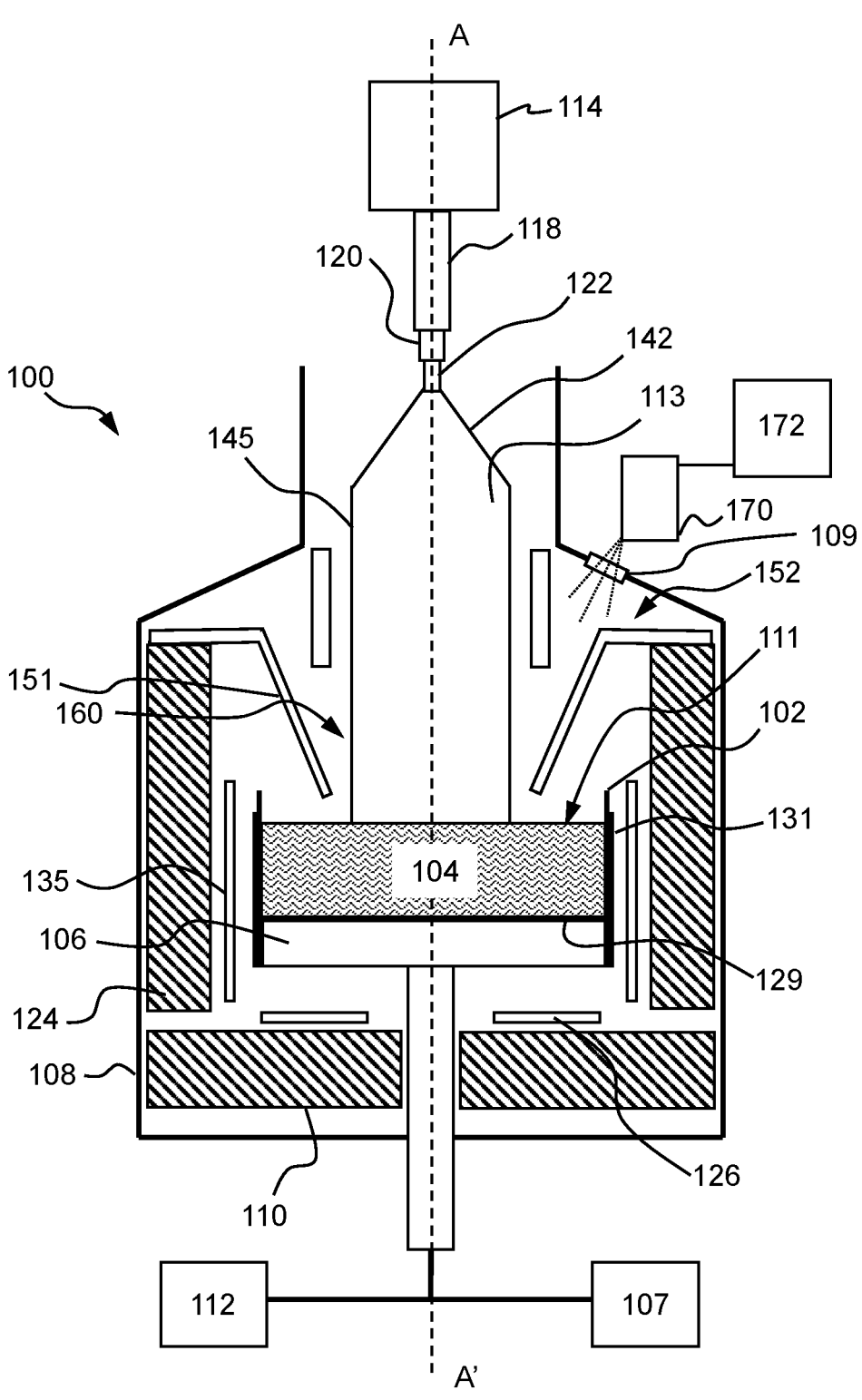
FIG. 1 is a section view of an ingot puller apparatus used to pull a single crystal silicon ingot from a silicon melt.
Figure 2:
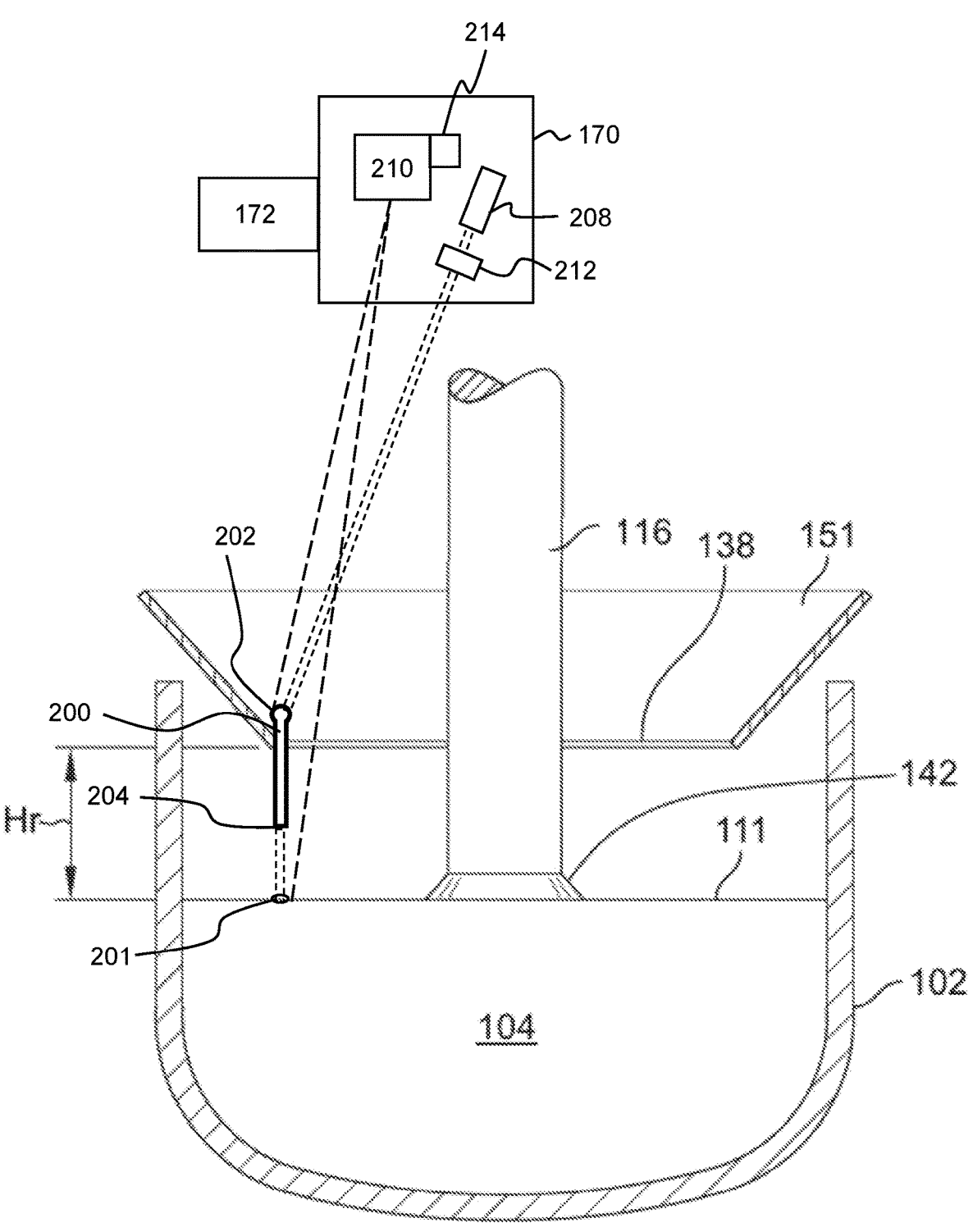
FIG. 2 is a section view of a portion of another ingot puller apparatus used to pull a single crystal silicon ingot from a silicon melt.
Figure 3:
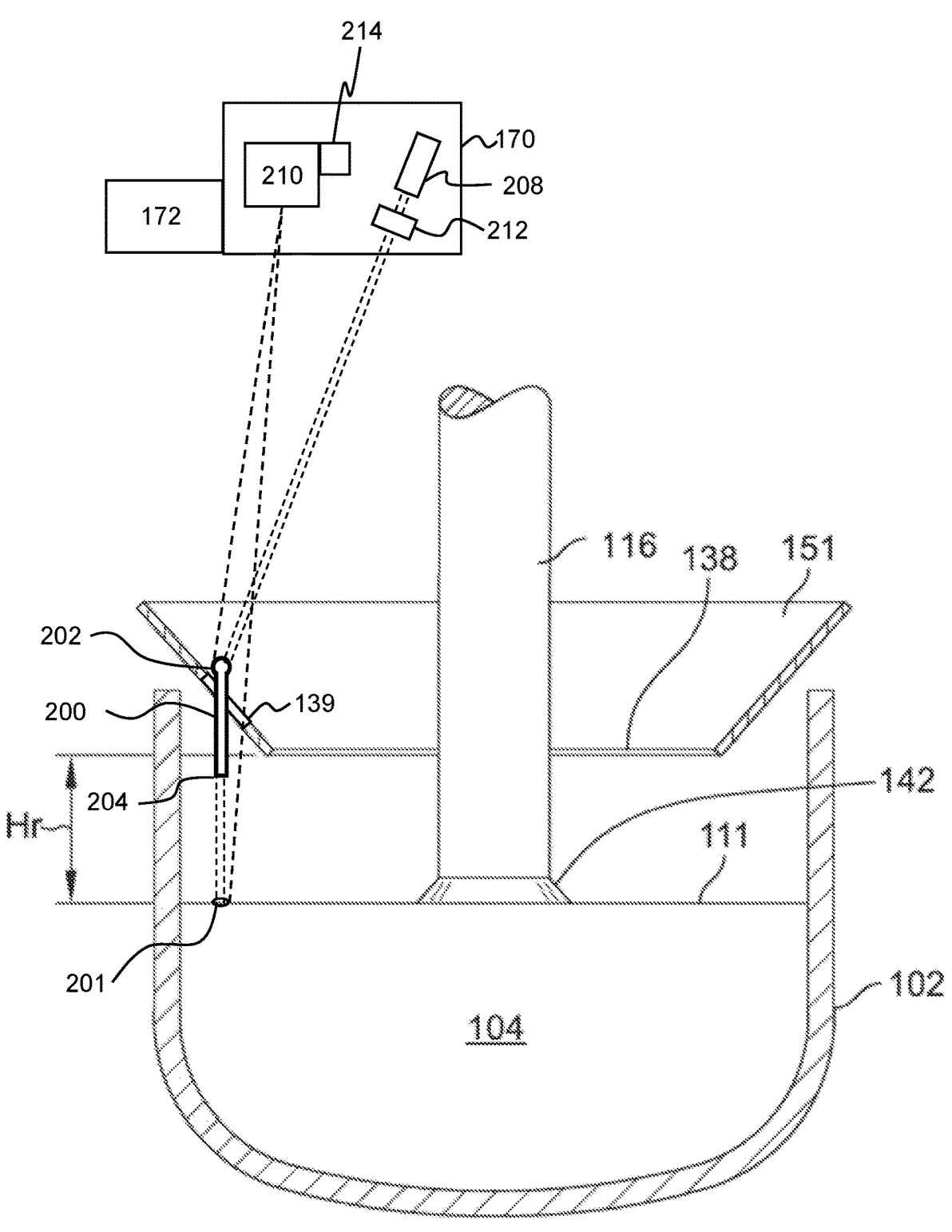
FIG. 3 is a section view of another example ingot puller apparatus used to pull a single crystal silicon ingot from a silicon melt.
Figure 4:
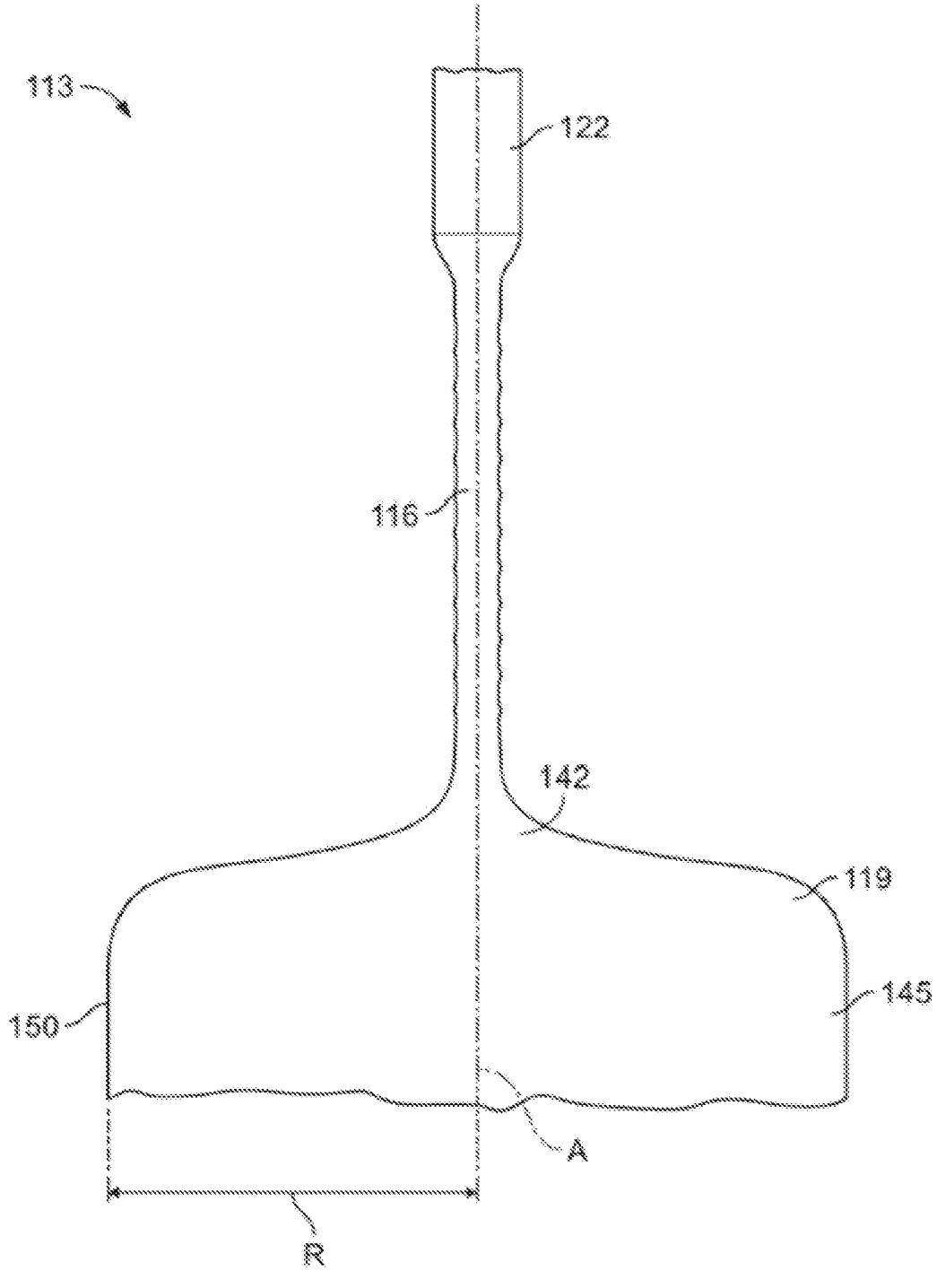
FIG. 4 is a partial view of a single crystal silicon ingot grown by the Czochralski method.

An ingot puller apparatus (or more simply "ingot puller" or a "crystal puller") for growing a monocrystalline silicon ingot will be described with reference to FIGS. 1-4. FIG. 1 is a cross-section view of an ingot puller apparatus indicated generally at "100" used to pull a single crystal silicon ingot from a silicon melt. FIGS. 2 and 3 are cross-section views of the ingot puller apparatus 100, and FIG. 4 is a partial front view of a single crystal silicon ingot grown by the Czochralski method, for example in the ingot puller apparatus 100.

The ingot puller apparatus 100 includes a crystal puller housing 108 that defines a growth chamber 152 for pulling a silicon ingot 113 from a melt 104 of silicon. A control system 172 (also referred to as a "controller") controls operation of the ingot puller 100 and its components. The ingot puller apparatus 100 includes a crucible 102 disposed within the growth chamber 152 for holding the melt 104 of silicon. The crucible 102 is supported by a susceptor 106.

The crucible 102 includes a floor 129 and a sidewall 131 that extends upward from the floor 129. The sidewall 131 is generally vertical. The floor 129 includes the curved portion of the crucible 102 that extends below the sidewall 131. Within the crucible 102 is a silicon melt 104 having a melt surface 111 (i.e., melt-ingot interface). The susceptor 106 is supported by a shaft 105. The susceptor 106, crucible 102, shaft 105 and ingot 113 have a common longitudinal axis A or "pull axis" A.

A pulling mechanism 114 is disposed within the ingot puller apparatus 100 for growing and pulling an ingot 113 from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown) within the pulling mechanism 114, or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 to be pulled from the melt 104.

During heating and crystal pulling, a crucible drive unit 107 (e.g., a motor) rotates the crucible 102 and susceptor 106. A lift mechanism 112 raises and lowers the crucible 102 along the pull axis A during the growth process. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100.

A crystal drive unit (not shown) may also rotate the pulling cable 118 and ingot 113 in a direction opposite the direction in which the crucible drive unit 107 rotates the crucible 102 (e.g., counter-rotation). In embodiments using iso-rotation, the crystal drive unit may rotate the pulling cable 118 in the same direction in which the crucible drive unit 107 rotates the crucible 102. In addition, the crystal drive unit raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102 (e.g., charge of 250 kg or more). A variety of sources of polycrystalline silicon may be used including, for example, granular polycrystalline silicon produced by thermal decomposition of silane or a halosilane in a fluidized bed reactor or polycrystalline silicon produced in a Siemens reactor. Once polycrystalline silicon is added to the crucible to form a charge, the charge is heated to a temperature above about the melting temperature of silicon (e.g., about 1412° C.) to melt the charge. In some embodiments, the charge (i.e., the resulting melt) is heated to a temperature of at least about 1425° C., at least about 1450° C. or even at least about 1500° C. The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline charged to the crucible 102.

To form the ingot, the seed crystal 122 is contacted with the surface 111 of the melt 104. The pulling mechanism 114 is operated to pull the seed crystal 122 from the melt 104. The ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104. The ingot 113 has a central longitudinal axis A that extends through the crown portion 142 and a terminal end of the ingot 113.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by the control system 172 so that the temperature of the melt 104 is controlled throughout the pulling process.

The ingot puller apparatus 100 may also include a reflector 151 (or "heat shield") disposed within the growth chamber 152 and above the melt 104 which shrouds the ingot 113 during ingot growth. The reflector 151 may be partially disposed within the crucible 102 during crystal growth. The reflector 151 defines a central passage 160 for receiving the ingot 113 as the ingot is pulled by the pulling mechanism 114.

The reflector 151 may be a heat shield adapted to retain heat underneath itself and above the melt 104. Other reflector designs and materials of construction (e.g., graphite) may be used without limitation. The reflector 151 has a bottom 138 (as best shown in FIG. 2) and the bottom 138 of the reflector 151 is separated from the surface of the melt by a distance HR during ingot growth. As the ingot 113 is pulled, the distance HR is increased due to expenditure of the melt 104.

The terms "light," "light emission," "coherent light," "incoherent light" and "light beams" refer to photon energy emitted by sources and components of the ingot puller apparatus. The light emitted can be visible or invisible to the human eye. The light can be in the broadband spectral regions (i.e., from Ultra-Violet to Infra-Red). The emitted light can be "coherent" or "incoherent" light. Coherent light has a constant phase difference between waves of light from the emission source. Incoherent or noncoherent light has a non-constant or random phase difference between waves of light from the emission source. Coherent light can be emanated due to optical intensification of fortified outflow of electromagnetic radiation. Incoherent light can be emitted due to photoluminescence and thermoluminescence from molten or heated sources. As used herein, "captured light" or "captured image" refers to light observed by a sensor or a detector.

An example single crystal silicon ingot 113 produced by the Czochralski method is shown in FIG. 3. The ingot 113 includes a neck 116, an outwardly flaring portion 142 (synonymously "crown" or "cone"), a shoulder 119 and a constant diameter main body 145. The neck 116 is attached to the seed crystal 122 that was contacted with the melt and withdrawn to form the ingot 113. The main body 145 is suspended from the neck 116. The neck 116 terminates once the cone portion 142 of the ingot 113 begins to form.

The constant diameter portion 145 of the ingot 113 has a circumferential edge 150, a central axis A that is parallel to the circumferential edge 150 and a radius R that extends from the central axis A to the circumferential edge 145. The central axis A also passes through the cone 142 and neck 116. The diameter of the main ingot body 145 may vary and, in some embodiments, the diameter may be about 150 mm, about 200 mm, about 300 mm, greater than about 300 mm, about 450 mm or even greater than about 450 mm.

The single crystal silicon ingot 113 may generally have any resistivity. The single crystal silicon ingot 113 may be doped or undoped.

Figure 5:
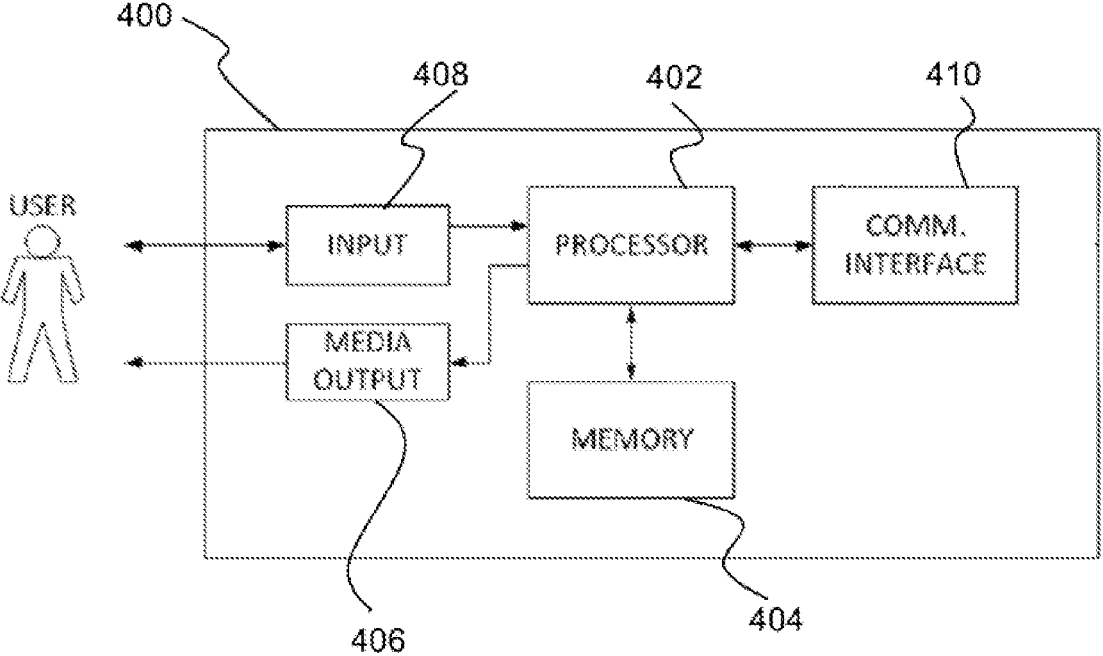
FIG. 5 is a simplified block diagram of a computing device for use in the control system of an example ingot puller apparatus of FIG. 1.

FIG. 5 is an example computing device 400 that may be used as or as part of the control system 172. The computing device 400 includes a processor 402, a memory 404, a media output component 406, an input device 408, and a communications interface 410. Other embodiments include different components, additional components, and/or do not include all components shown in FIG. 5. The processor 402 is configured for executing instructions. In some embodiments, executable instructions are stored in the memory 404. The processor 402 may include one or more processing units (e.g., in a multi-core configuration). The term processor, as used herein, refers to central processing units, microprocessors, microcontrollers, reduced instruction set circuits (RISC), application specific integrated circuits (ASIC), a programmable logic circuit (PLC), and any other circuit or processor capable of executing the functions described herein. The above are examples only, and are thus not intended to limit in any way the definition and/or meaning of the term "processor." The memory 404 stores non-transitory, computer-readable instructions for performance of the techniques described herein. Such instructions, when executed by the processor 402, cause the processor 402 to perform at least a portion of the methods described herein. In some embodiments, the memory 404 stores computer-readable instructions for providing a user interface to the user via media output component 406 and, receiving and processing input from input device 408. The memory 404 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Although illustrated as separate from the processor 402, in some embodiments the memory 404 is combined with the processor 402, such as in a microcontroller or microprocessor, but may still be referred to separately. The above memory types are examples only, and are thus not limiting as to the types of memory usable for storage of a computer program. The media output component 406 is configured for presenting information to the user (e.g., the operator of the system). The media output component 406 is any component capable of conveying information to the user. In some embodiments, the media output component 406 includes an output adapter such as a video adapter and/or an audio adapter. The output adapter is operatively connected to the processor 402 and operatively connectable to an output device such as a display device (e.g., a liquid crystal display (LCD), light emitting diode (LED) display, organic light emitting diode (OLED) display, cathode ray tube (CRT), "electronic ink" display, one or more light emitting diodes (LEDs)) or an audio output device (e.g., a speaker or headphones).

The computing device 400 includes, or is connected to, the input device 408 for receiving input from the user. The input device 408 is any device that permits the computing device 400 to receive analog and/or digital commands, instructions, or other inputs from the user, including visual, audio, touch, button presses, stylus taps, etc. The input device 408 may include, for example, a variable resistor, an input dial, a keyboard/keypad, a pointing device, a mouse, a stylus, a touch sensitive panel (e.g., a touch pad or a touch screen), a gyroscope, an accelerometer, a position detector, an audio input device, or any combination thereof. A single component such as a touch screen may function as both an output device of the media output component 406 and the input device 408.

The communication interface enables the computing device 400 to communicate with remote devices and systems, such as remote sensors, remote databases, remote computing devices, and the like, and may include more than one communication interface for interacting with more than one remote device or system. The communication interfaces may be wired or wireless communications interfaces that permit the computing device 400 to communicate with the remote devices and systems directly or via a network. Wireless communication interfaces may include a radio frequency (RF) transceiver, a Bluetooth® adapter, a Wi-Fi transceiver, a ZigBee® transceiver, a near field communication (NFC) transceiver, an infrared (IR) transceiver, and/or any other device and communication protocol for wireless communication. (Bluetooth is a registered trademark of Bluetooth Special Interest Group of Kirkland, Washington; ZigBee is a registered trademark of the ZigBee Alliance of San Ramon, California.) Wired communication interfaces may use any suitable wired communication protocol for direct communication including, without limitation, USB, RS232, I2C, SPI, analog, and proprietary I/O protocols. In some embodiments, the wired communication interfaces include a wired network adapter allowing the computing device 400 to be coupled to a network, such as the Internet, a local area network (LAN), a wide area network (WAN), a mesh network, and/or any other network to communicate with remote devices and systems via the network.

The computer systems discussed herein may include additional, less, or alternate functionality, including that discussed elsewhere herein. The computer systems discussed herein may include or be implemented via computer-executable instructions stored on non-transitory computer-readable media or medium.

As shown in FIGS. 1 through 4, the ingot puller apparatus includes a measurement assembly 170 that is used as part of a measurement system to determine a distance between the reflector 151 or a target object 200 and the surface 111 of the melt 104. As shown in FIGS. 2 and 3, the measurement assembly 170 can be used to determine the distance between the bottom 138 of the reflector 151 and the surface of the melt (i.e., to determine HR) during ingot growth. The measurement assembly 170, systems and methods described herein can also be used to determine other distances from the surface 111 of the melt 104 within the crystal puller 100. The measurement assembly 170 may be configured to measure any vertical distance (parallel to the axis X of FIG. 1) using the systems and methods as described in further detail below.

The measurement assembly 170 and the controller 172 define a measurement system. The measurement assembly 170 is used by the controller 172 to determine the distance between the bottom 138 of the reflector 151 and the surface 111 of the silicon melt 104. The measurement assembly 170 includes a target object 200 positioned within the growth chamber 152 of the ingot puller apparatus 100, a detector array 210 positioned outside of the growth chamber 152 to capture light from within the growth chamber 152, a laser 208 the growth chamber 152 to selectively transmit a coherent light beam to the target object 200, and an optical modulator 212 to pulse the coherent light beams of the laser into discrete coherent light beams having a period. A lock-in amplifier 214 can be connected to the detector array 210 to filter discrete coherent light beams having the period from captured light. The lock-in amplifier 214 can amplify the discrete coherent light beams having the period from incoherent light present within the growth chamber 152.

Generally, the laser 208 (such as a laser diode) is focused on the target object 200 which projects a laser dot on the melt surface 111. The target object 200 is translucent or opaque such that focusing of light from the laser on a first end 202 or a point of the target object 200 refracts the light to a second end 204 or point opposite the first end 202. The refracted light from the second end 204 or point projects the light onto the melt surface 111. As shown in FIGS. 2 and 3, a projection 201 is displayed on the melt surface 111. The projection 201 can have a diameter and shape substantially equal to the second end 204 of the target object 200 and emits coherent light due to the refraction which can be detected by a detector array 210. The first end 202 of the target object 200 also reflects coherent light from the laser which is detectably by the detector array 210.

The laser 208 is suitably a five milliwatt, 520 nm wavelength, diode laser with <0.3 divergence and three beam dimension capable of delivering a coherent light beam to the target object 200. Because the melt is generally reddish in color, a green laser provides a more visible contrast between the dot and the melt than some other colors. Other embodiments may use any other suitable color laser.

The detector array 210 is positioned outside of the crystal puller housing 108 and is directed to capture light emitted from at least the first end 202 of the target object 200 and the projection 210 on the melt surface 111. The detector array 210 is positioned such that it has a view of the growth chamber 152 through an opening 109 in the crystal puller housing 108 (as shown in FIG. 1). For the remainder of the run the laser dot is constantly tracked with the camera to determine HR. The measurement system does not rely on contact with the melt to find HR.

The detector array 210 is suitably a photodiode or a positional sensor for detection and measurement of wavelengths of light along a spectrum. The detector array 210 converts wavelength measurements into distance measurements between the detector array 210 and the elements emitting light. In some embodiments, the detector array 210 is a charged-coupled device (CCD) camera or a charge injection devices (CID) camera. CCD and CID cameras utilize an image sensor to register visible light as an electronic signal and convert the light into a two-dimensional pixelated image, each image including the surface of the silicon melt in the crystal puller, the target object and the reflection of the target object on the silicon melt.

The target object 200 may be a quartz pin created from stock rod. The target object 200 is optically transparent. In other embodiments, the target object 200 may be made of any high temperature refractor, such as Silicon Carbide (SiC), Silicon Nitride (SiN), Tungsten Carbide, Tantalum Carbide, quartz, sapphire, Boron Nitride or any other optically transparent, heat resistant material. Generally, the pin material should produce a strong, well-defined reflection on the melting surface during all interesting crystal growth phases. In one example, the stock quartz rod is 3 mm stock rod. Alternatively, stock rod of any other diameter may be used. The pins may have heads that are made or formed from the rod, for example when a long light-travelling pin is needed. In this case, when the laser light needs to be seen from a pin tail but the laser light is shown on a pin head, the pins are one continuous piece, rather than a pin with a sphere welded on it, to ensure that the light from the laser is light piped to the bottom of the pin when the laser is shone on the pin head.

As shown in FIG. 2, the target object 200 is positioned on an edge of the bottom 138 of the reflector 151. As shown in FIG. 3, the target object 200 can be positioned and extend through an opening 139 in the reflector 151. The opening 139 is sized to allow for the detector array 210 to have a view of at least the first end 202 of the target object and the projection 201 displayed on the melt surface 111. The opening 139 in the reflector 151 is a compound angle to allow viewing of the target object 200 from a lateral edge of the same port as the detector array 210 and laser 208 are mounted. Unlike some known dipstick laser systems that use "open" hotzones with reflectors that do not insulate as well, the present systems are used in a "closed" hotzone where the reflector 151 fills in as much area as possible above the melt 104 with insulation. Open hotzone systems use a view around the outside of the largest crystal diameter from a port on the opposite side of the crystal as the target object 200 to see the reflection of the bottom of one of the target object 200 illuminated by the laser 208 in the melt. The example embodiments allow a closed hotzone, yet permit the laser 208 dot reflection to be seen from the same port as it is from, while still retaining high resolution HR capability despite the steep angle of the cutout. Other embodiments may use multiple ports (e.g., with the camera and laser on different ports).

Using a bright laser provides a consistent signal on the melt. General commercially available green wavelength lasers (520 nm to 532 nm wavelength) of various power ratings are typically bright enough under all conditions. This avoids problems with some known detector arrays, optical sensors and camera systems that rely on visually observing features in the hotzone that can have varying light intensity due to reflections and emission of light from the silicon melt. The light intensity variation can create shadows that can cause hotzone objects to appear to move by a pixel or two. This can create a false movement (i.e., an HR change).

The optical modulator 212 is selected from a pulse width modulator or an optical chopper. The pulse width modulator can be connected to the laser 208 or can be integral with the laser 208, and pulses the coherent light beams of the laser into discrete coherent light beams having a period. The optical chopper is positioned between the laser 208 and the target object 200 to chop the coherent light beams of the laser into discrete coherent light beams having a period. In either configuration, the coherent light beams are blocked for a period of time, essentially creating a brief flicker. The period can be for a fraction of a second, and in some embodiments, is not visible to the human eye. The flicker of coherent light emitted by the laser 208 and refracted by the target object 200 is also translated to the projection 201 displayed on the melt surface 111.

The lock-in amplifier 214 can extract the coherent light having the period from the environment by syncing the lock-in amplifier 214 to the period of the optical modulator 212, thus improving the accuracy and sensitivity of the detector array 210 by separating discrete coherent light beams having a period from light within the growth chamber 152.

The lock-in amplifier 214 can also filter for light driven by AC voltage having a particular frequency. Generally, electrical components operating on DC and AC voltage emit light in accordance with the frequency operated. The heaters can operate with DC voltage, thus emitting light without a frequency and the laser can operate with AC voltage, thus emitting coherent light beams with the frequency. The emitted coherent light beams with the frequency can filtered from non-coherent light and DC light.

Figure 6:
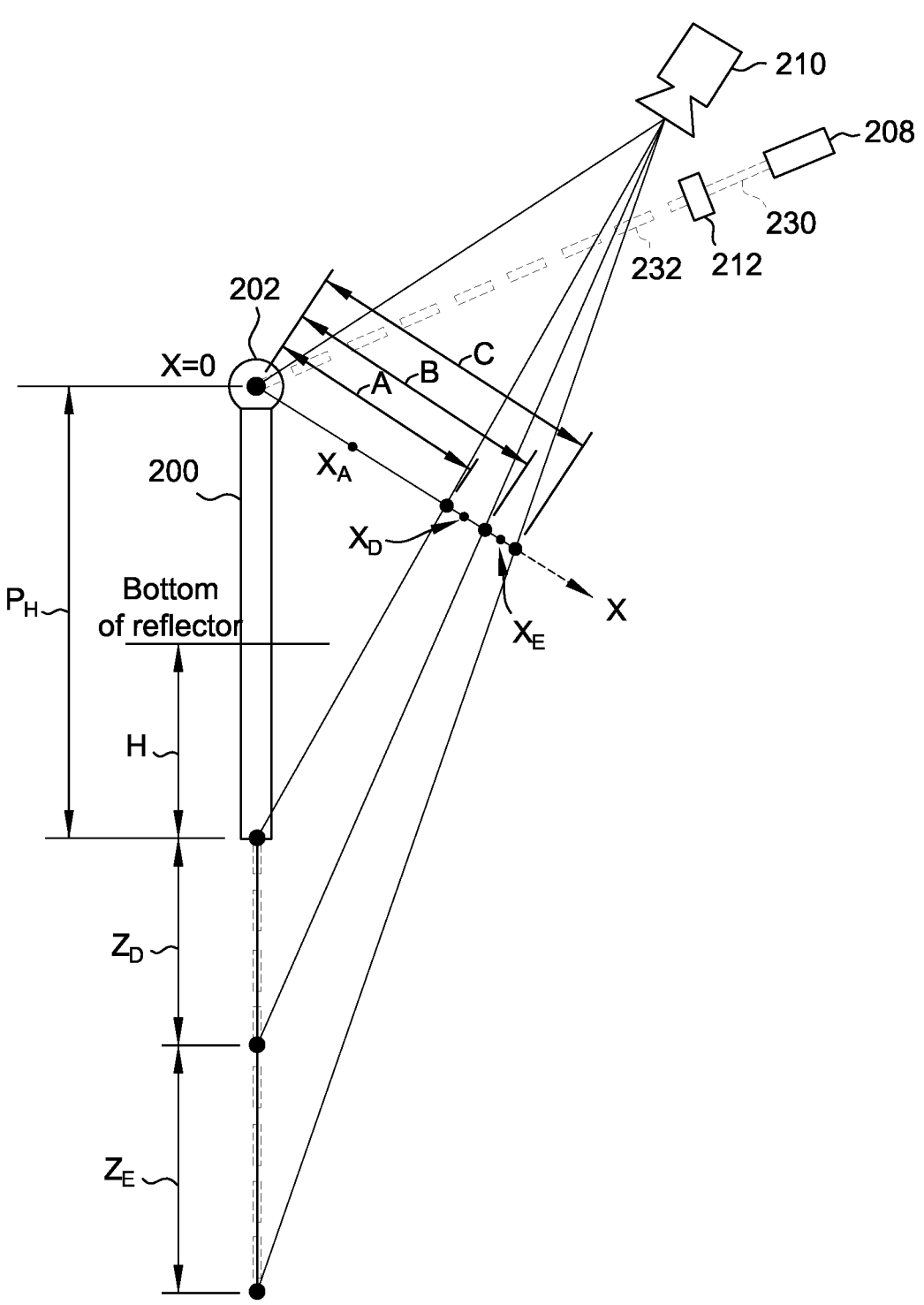
FIG. 6 is a view of the geometry of the measurement assembly of FIG. 1.

FIG. 6 is a schematic representation of the field of view of the detector array 210 and the laser 208. The detector array 210 is positioned such that the target object 200 and the projection 201 displayed on the melt surface 111. The detector array 210 captures light through the opening 109 in the crystal puller housing 108. The light captured by the detector array includes incoherent light from heater 135 and bottom heater 126, as well as coherent light emitted by the laser 208. The field of view of the detector array 210 includes the first end 202 of the target object 200 and the projection 201 at various distances from the second end 204 of the target object 200 (noted as (ZD) and (ZE)). The laser 208 selectively transmits coherent light beams 230 through the opening to the target object 200 to produce the reflection 201 of the target object on the surface 111 of the silicon melt. The optical modulator 212 pulses the coherent light beams 230 of the laser 208 into discrete coherent light beams 232 having a period. The lock-in amplifier 214 filters out coherent light beams 232 having a period from incoherent light.

To use the measurement system, the height (PH) of the target object 200, the diameter (PD) of first end 202 of the target object 200, and the distance that the target object 200 extends from the bottom of the reflector (H) is known. The laser 208 and optical modulator 212 are turned on and discrete coherent light beams having a period are shone onto the first end 202 of the target object 200. The discrete coherent light beams are refracted through the target object 200 (to the second end 204) and the projection 201 is displayed on the melt surface 111. As the crucible lift 112 moves the crucible 102 and the melt surface 111 relative to the bottom surface 138 of the reflector 151, the measurement distance changes (as illustrated by (ZD) and (ZE) in FIG. 6).

In some embodiments, the controller 172 locates the tangent edges, rather than directly finding the centers, and the previously measured diameter (PD) of the head of the target object 200 is used to find the head center. The center of the lower edge of the pin is found using the known value of the pin diameter (either measured or not measured because it is made from stock material having a known diameter). The measured distances from captured light by the detector array 210 can be used to triangulate the length of the height (PH) of the target object 200 and establish a reference number which, with the use of ratios, can be used to calculate unknown distances (ZD) and (ZE). Where the detector array 210 is a camera, the resulting distances of the projection 201 can be represented with pixel locations that correlates to the aforementioned points.

The controller 172 is connected to the detector array 210, the laser 208 and the optical modulator 212 and is programmed to execute the following functions. The laser 208 is controlled to direct the discrete coherent light beams from the laser 208 to the target object 200, to control the optical modulator 212 to pulse the coherent light beams of the laser 208 into discrete coherent light beams, control the detector array 210 to capture light through the opening while the discrete coherent light beams are directed at the target object 200, control the detector array 210 to filter the discrete coherent light beams having the period from the captured light and to control the lock-in amplifier to filter discrete coherent light having the period from captured light. The controller, for example by use of the processor, calculates a measurement distance between the surface of the silicon melt and a bottom surface of the reflector based on a location of the reflection 201 of the target object 200.

An example method 500 as shown in FIG. 7 for determining a distance between a silicon melt in a crucible and a reflector in a crystal puller while a crystal is being pulled from the silicon melt. The method includes the steps of directing 502 coherent light beams from a laser to a target object mounted on the reflector and visible through an opening, pulsing 504 the coherent light beams from the laser into discrete coherent light beams having a period using an optical modulator, and capturing 506 discrete light through the opening using a detector array positioned outside of the crystal puller while the discrete coherent light beams are directed at the target object. The method also includes determining 508, by a controller, a distance between the surface of the silicon melt and a bottom surface of the reflector based on a location of the reflection of the target object. The method may also comprise the step of filtering 510 discrete coherent light beams using a lock-in amplifier connected to the detector array.

The example methods do not require the particular order of steps, or sequential order. In addition, other steps may be included, or steps may be eliminated, from the described methods, and other components may be added to, or removed from, the described systems. It will be appreciated that the above embodiments that have been described in particular detail are merely example or possible embodiments, and that there are many other combinations, additions, or alternatives.

Also, the particular naming of the components, capitalization of terms, the attributes, data structures, or any other programming or structural aspect is not mandatory or significant, and the mechanisms that implement the disclosure or its features may have different names, formats, or protocols. Further, the system may be implemented via a combination of hardware and software, as described, or entirely in hardware elements. Also, the particular division of functionality between the various system components described herein is merely one example, and not mandatory; functions performed by a single system component may instead be performed by multiple components, and functions performed by multiple components may instead performed by a single component.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Various changes, modifications, and alterations in the teachings of the present disclosure may be contemplated by those skilled in the art without departing from the intended spirit and scope thereof. It is intended that the present disclosure encompass such changes and modifications.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A crystal puller having at least one heater, a silicon melt in a crucible and a measurement system for determining a distance between the silicon melt and a reflector while a crystal is being pulled from the silicon melt, the system comprising:
   a reflector defining a central passage through which the crystal is pulled and an opening; and
   a measurement assembly comprising:
      a target object at least partially visible through the opening;
      a detector array to capture light through the opening, the detector array directed to a surface of the silicon melt in the crystal puller and to the target object;
      a laser to selectively transmit a coherent light beam through the same opening through which the detector array captures light, to the target object to produce a reflection of the target object on the surface of the silicon melt;
      an optical modulator to pulse the coherent light beams of the laser into discrete coherent light beams having a period; and,
   a controller connected to the detector array, the laser and the optical modulator, the controller programmed to:
      control the laser to direct the discrete coherent light beams from the laser to the target object,
      control the optical modulator to pulse the coherent light beams of the laser into discrete coherent light beams;
      control the detector array to capture light through the opening while the discrete coherent light beams are directed at the target object, wherein the captured light including at least a part of the surface of the silicon melt on which the reflection of the target object is visible, and
      control the detector array to filter the discrete coherent light beams having the period from the captured light.

2. The crystal puller of claim 1, wherein directing discrete coherent light beams from the laser to the target object projects the reflection of the target object onto the surface of the silicon melt.

3. The crystal puller of claim 2, wherein the controller is programmed to determine a measurement distance between the surface of the silicon melt and a bottom surface of the reflector based on a location of the projection of the target object in the captured light.

4. The crystal puller of claim 1, wherein captured light from the detector array includes incoherent light emitted from at least the silicon melt, and discrete coherent light beams from the laser and the optical modulator.

5. The crystal puller of claim 4, wherein a lock-in amplifier is connected to the detector array to filter discrete coherent light beams having the period from captured light.

6. The crystal puller of claim 1, wherein a lock-in amplifier is connected to the detector array to filter discrete coherent light beams having the period from captured light by amplifying the discrete coherent light beams having the period.

7. The crystal puller of claim 1, wherein the target object has a first end and a second end opposite the first end, the target object mounted to the reflector, wherein the target object refracts light between the first end and the second end.

8. The crystal puller of claim 7, wherein a projection of the target object from the second end of the target reflection creates a reflection of the target object on the surface melt.

9. The crystal puller of claim 1, wherein the detector array is an optical sensor to convert captured light into pixelated images through the opening in the reflector, each image including the surface of the silicon melt in the crystal puller, the target object and the reflection of the target object on the silicon melt.

10. The crystal puller of claim 1, wherein the optical modulator is selected from a pulse width modulator or an optical chopper, wherein the pulse width modulator is connected to the laser and pulses the coherent light beams of the laser, wherein the optical chopper is positioned between the laser and the target object to chop the coherent light beams of the laser.

11. A measurement system comprising:

a target object at least partially visible through an opening in a crystal puller, the crystal puller having a silicon melt in a crucible and a reflector defining a central passage through which a crystal is pulled;

a detector array to capture light through the opening, the detector array directed to a surface of the silicon melt in the crystal puller and to the target object;

a laser to selectively transmit a coherent light beam through the same opening through which the detector array captures light, to the target object to produce a reflection of the target object on the surface of the silicon melt;

an optical modulator to pulse the coherent light beams of the laser into discrete coherent light beams having a period; and, a lock-in amplifier connected to the detector array to filter discrete coherent light having the period from captured light;

wherein a controller is programmed to determine measurement distances from a surface of the silicon melt while the crystal is being pulled from the silicon melt by:

controlling the laser to direct coherent light beams from the laser to a first end of the target object, the first end visible by the laser through the opening;

controlling the optical modulator to pulse the coherent light beam of the laser;

controlling the detector array to capture light;

controlling a lock-in amplifier to filter discrete coherent light beams having the period from the captured light, the lock-in amplifier connected to the detector array; and, determining, by the controller, a measurement distance between the surface of the silicon melt and a bottom surface of the reflector based on a location of the reflection of the target object.

12. The measurement system of claim 11, wherein the captured light includes light emitted from the silicon melt and discrete coherent light beams having the period, wherein the lock-in amplifier filters out light emitted from the silicon melt.

13. The measurement system of claim 12, wherein a second end of the target object extends from the bottom surface of the reflector by a length.

14. The measurement system of claim 13, wherein the measurement distance is determined at least in part on a location of the reflection of the first end of the target and known dimensions of the target object.

15. The measurement system of claim 13, wherein the measurement distance is triangulated from the first end of the target object and the reflection of the target object on the surface of the silicon melt.

16. The measurement system of claim 11, wherein the controller is programmed to control a crucible lift to move the crucible to change the measurement distance between the surface of the silicon melt and the bottom surface of the reflector.

17. A method of determining a distance between a silicon melt in a crucible and a reflector in a crystal puller while a crystal is being pulled from the silicon melt using a measurement system:

directing coherent light beams from a laser to a target object mounted on the reflector and visible through an opening, the laser positioned outside of the crystal puller;

pulsing the coherent light beams from the laser into discrete coherent light beams having a period using an optical modulator, wherein the optical modulator is selected from a pulse width modulator and an optical chopper, wherein the pulse width modulator is connected to the laser and pulses the coherent light beams of the laser, wherein the optical chopper is positioned between the laser and the target object to chop the coherent light beams of the laser;

capturing discrete light through the same opening through which the coherent light beams are directed using a detector array positioned outside of the crystal puller while the discrete coherent light beams are directed at the target object, the captured light including at least a part of a surface of the silicon melt on which the reflection of the target object is visible; and determining, by a controller, a distance between the surface of the silicon melt and a bottom surface of the reflector based on a location of the reflection of the target object.

18. The method of claim 17, wherein the captured light by the detector array includes the discrete coherent light beams emitted from the laser and light emitted from the silicon melt.

19. The method of claim 18 further comprising filtering discrete coherent light beams using a lock-in amplifier connected to the detector array.

20. The method of claim 17, wherein the determining step includes triangulating from a first end of the target object and the reflection of the target object on the surface of the silicon melt.

* * * * *